United States Patent

Hsu

Patent Number: 5,877,060
Date of Patent: Mar. 2, 1999

[54] METHOD FOR FABRICATING SRAM POLYLOAD

[75] Inventor: Je-Jung Hsu, Hsinchu City, Taiwan

[73] Assignee: Winbond Electronics Corp., Taipei, Taiwan

[21] Appl. No.: 837,462

[22] Filed: Apr. 18, 1997

[30] Foreign Application Priority Data

Feb. 11, 1997 [TW] Taiwan ................................. 86101494

[51] Int. Cl.⁶ .................................................. H01L 21/20
[52] U.S. Cl. .......................... 438/385; 438/238; 438/453; 438/649
[58] Field of Search ...................................... 438/152, 238, 438/330–384, 385, 453–648, 655, 659, 155, 157

[56] References Cited

U.S. PATENT DOCUMENTS

| | | | |
|---|---|---|---|
| 4,569,122 | 2/1986 | Chan | 438/385 |
| 4,581,815 | 4/1986 | Cheung et al. | 438/385 |
| 4,604,789 | 8/1986 | Bourassa | 438/385 |
| 4,859,278 | 8/1989 | Choi | 438/385 |
| 5,330,930 | 7/1994 | Chi | 438/385 |
| 5,462,894 | 10/1995 | Spinner et al. | 438/385 |
| 5,622,884 | 4/1997 | Liu | 438/385 |
| 5,686,338 | 11/1997 | Liu | 438/385 |
| 5,705,418 | 1/1998 | Liu | 438/385 |

*Primary Examiner*—Charles Bowers
*Assistant Examiner*—Jack Chen
*Attorney, Agent, or Firm*—Finnegan, Henderson, Farabow, Garrett & Dunner, L.L.P.

[57] ABSTRACT

A method for fabricating SRAM polyloads that allows device dimension reduction yet maintains overall product functionality which includes the following steps: forming an insulating layer above a semiconductor substrate having a conductive gate device and a conductive voltage source line device already formed in it; etching the insulating layer selectively, and forming a first contact window and a second contact window on the surfaces of the conductive gate device and the conductive voltage source line device respectively; forming a polysilicon layer above the insulating layer, and filling up the first and the second contact windows at the same time; forming a silicide layer above the polysilicon layer; etching the silicide layer and the polysilicon layer to form a conductive wire linking the first contact window with the second contact window; and etching selectively section of the silicide layer on the conductive wire to expose the polysilicon layer below, and forming a polyload in the exposed polysilicon layer region thus created.

10 Claims, 5 Drawing Sheets

METHOD FOR FABRICATING SRAM POLYLOAD

BACKGROUND OF THE INVENTION

1. Field of Invention

This invention relates in general to the fabrication of integrated circuits, and more particularly to a fabricating method for static random-access-memory (SRAM) eligible for dimensional reduction and producing a higher level of integration.

2. Description of Related Art

SRAMs are now widely used inside many integrated circuit devices, particularly in the telecommunication and electronic industries. Therefore, how to miniaturize and how to increase the level of integration while maintaining device quality is the foremost goal for future development. Polysilicon load (or polyload) is one of the devices in a SRAM unit cell. The polyload functions as a resistor and is generally formed by lightly doping (or not doping at all) ions into a specific section of the polysilicon layer, while the other sections of the same polysilicon layer are more heavily doped to form the interconnects.

A circuit diagram for a conventional SRAM unit is shown in FIG. 1. Devices of a SRAM unit include two polyloads R1 and R2, two pull-down transistor Q1 and Q2, two pass transistors Q3 and Q4. Transistors Q1,Q2,Q3 and Q4 utilize a first polysilicon layer (poly1) as their gate terminals, and a second polysilicon layer (poly2) with the higher resistance sections serving as their polyloads and the lower resistance sections as their interconnects. Conventional fabricating techniques use the same polysilicon layer (poly2) for both the polyloads and the interconnects. Those sections designed to be the interconnects are heavily doped while the sections that serves as the polyloads are either lightly doped or simply not doped at all. The interconnects and the polyloads together constitute an electrical pathway for linking up a voltage source Vcc to node points A and B. Since the same polysilicon layer (poly2) is used for interconnects and polyloads in the conventional fabricating method, at least two doping operations are required.

To better understand the steps involved and the disadvantages of the conventional method for fabricating a SRAM polyload, an example is provided below.

FIG. 2 is a cross-sectional view showing the structure of a SRAM polyload formed by a conventional method. Referring to FIG. 2, the fabricating method first involves forming a polysilicon gate device 12 and a polysilicon voltage source line device 14 above a silicon substrate 10, and then depositing an insulating layer 16 on top, followed by etching the insulating layer 16 to form respectively a contact window 17a exposing the polysilicon gate device 12 below as well as another contact window 17b exposing the polysilicon voltage source line device 14 below. Next, a polysilicon layer covering the insulating layer 16, also filling up the contact windows 17a and 17b is formed. In the subsequent processing, section labelled 18 is lightly doped to act as a polyload region, while sections 20a and 20b are more heavily doped in a second doping operation to form the interconnect regions.

One major disadvantages of the SRAM polyload fabricated by the above conventional method is the necessity to take into consideration the lateral diffusion length of ions in the polysilicon layer, for example, about 1.5 μm, and so when further dimensional reduction for memory units are desired, ionic diffusion definitely sets a limit on the control of product quality. Furthermore, due to an uneven topography of the underlying layer, two adjacent polyloads produced alongside each other may be unsymmetrical, and as a result of such errors, may lead to a lack of stability for the memory units, and in more serious cases, may even affect device functioning.

SUMMARY OF THE INVENTION

It is therefore an object of this invention to provide a manufacturing method for SRAM polyloads utilizing the formation of a silicide layer above the polysilicon in regions designed for interconnects to replace the two separate ionic doping operations necessary for forming the polysilicon load and interconnects in a conventional process, thus eliminating concerns about the lateral diffusion length while still satisfying demands for further dimensional reduction.

Another object of this invention is to provide better control over the fabrication process by etching a silicide layer to define the polyload regions.

To achieve the objects stated above, a fabricating method for SRAM polyloads is provided which includes the following steps: forming an insulating layer above a semiconductor substrate having a conductive gate device and a conductive voltage source line device already formed in it; etching the insulating layer selectively, and forming a first contact window and a second contact window on the surfaces of the conductive gate device and the conductive voltage source line device respectively; forming a polysilicon layer above the insulating layer, and filling up the first and the second contact windows at the same time; forming a silicide layer above the polysilicon layer; etching the silicide layer and the polysilicon layer to form a conductive wire linking the first contact window with the second contact window; and etching selectively section of the silicide layer on the conductive wire to expose the polysilicon layer below, and forming a polyload in the exposed polysilicon layer region thus created.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
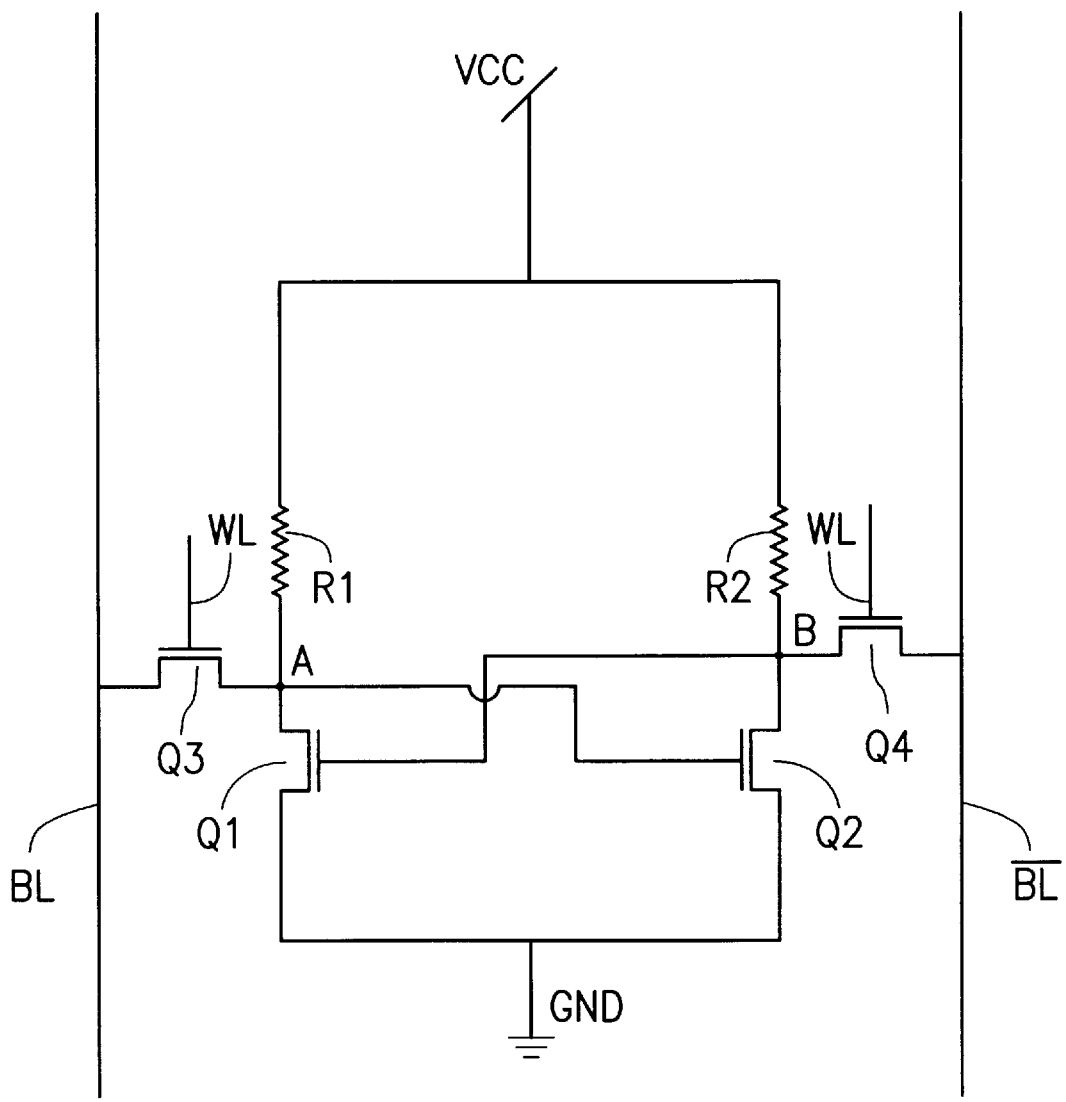
FIG. 1 is an SRAM circuit diagram.
Figure 2:
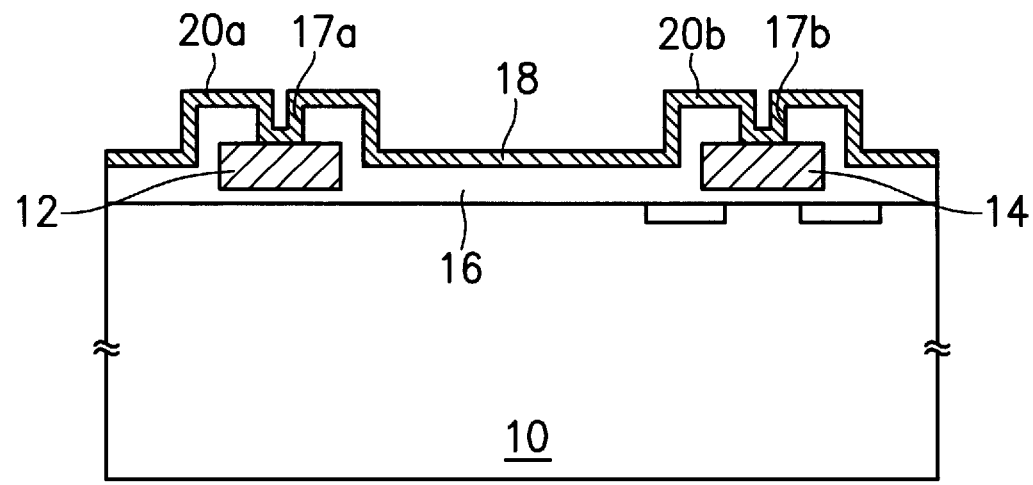
FIG. 2 is a cross-sectional view showing an SRAM polyload fabricated according to a conventional fabricating method.
Figure 3A:
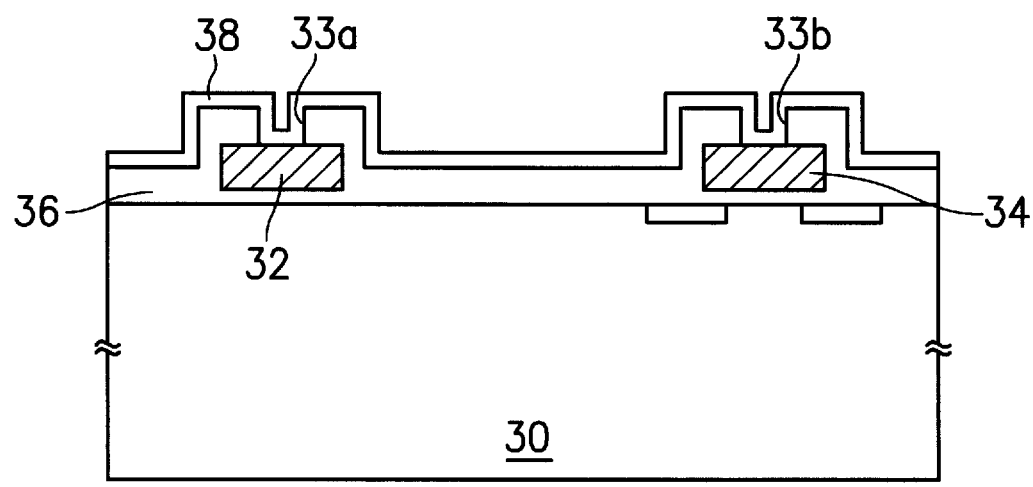
FIGS. 3A through 3E are cross-sectional views showing the fabricating steps required for producing an SRAM polyload according to one preferred embodiment of this invention.
Figure 3B:
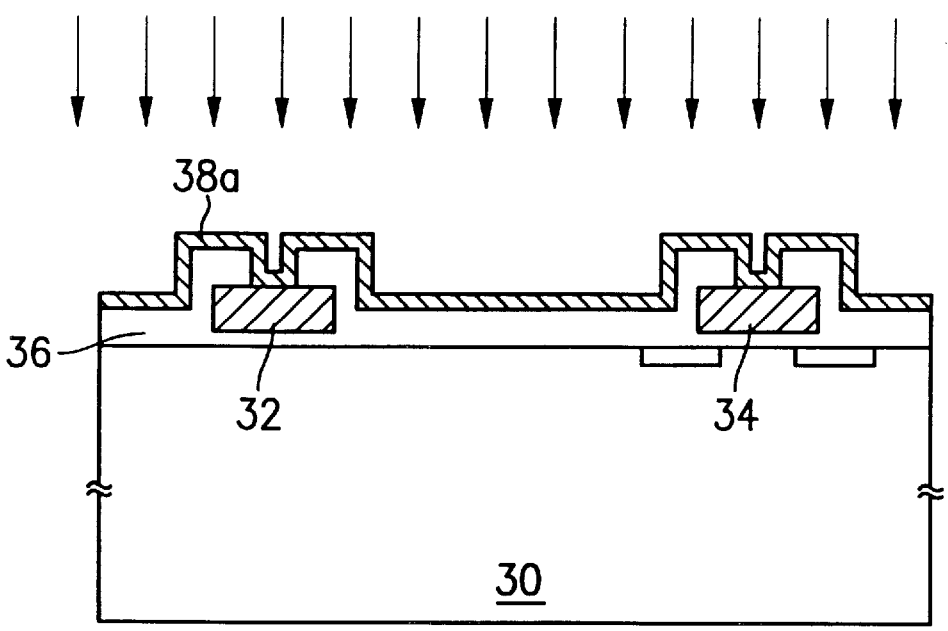
Figure 3C:
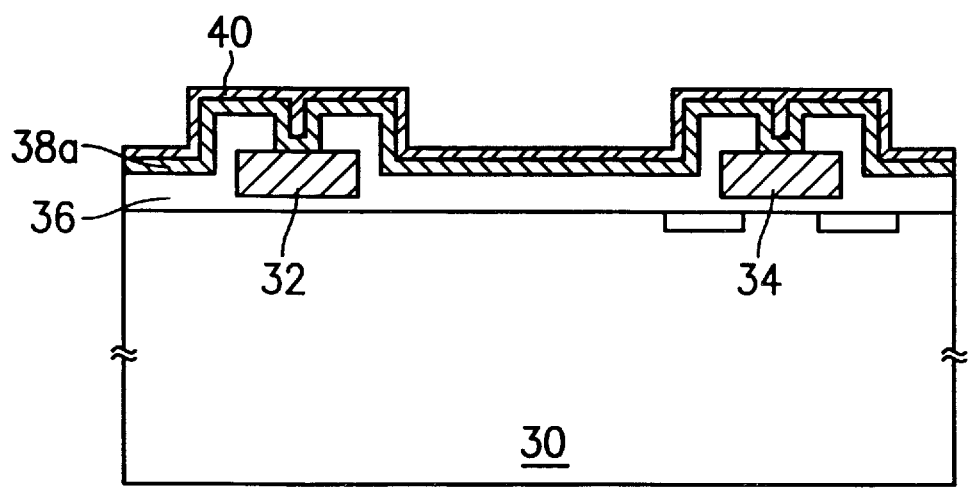
Figure 3D:
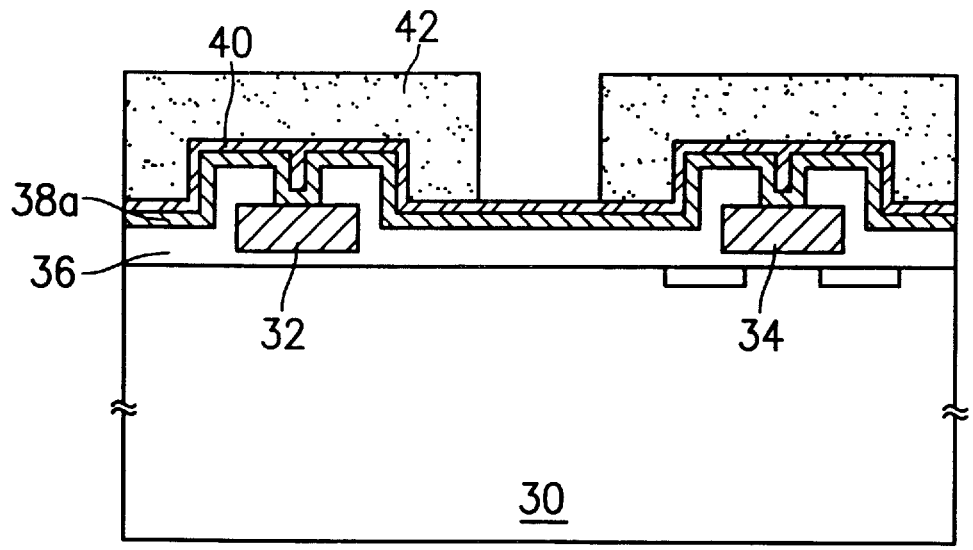
Figure 3E:
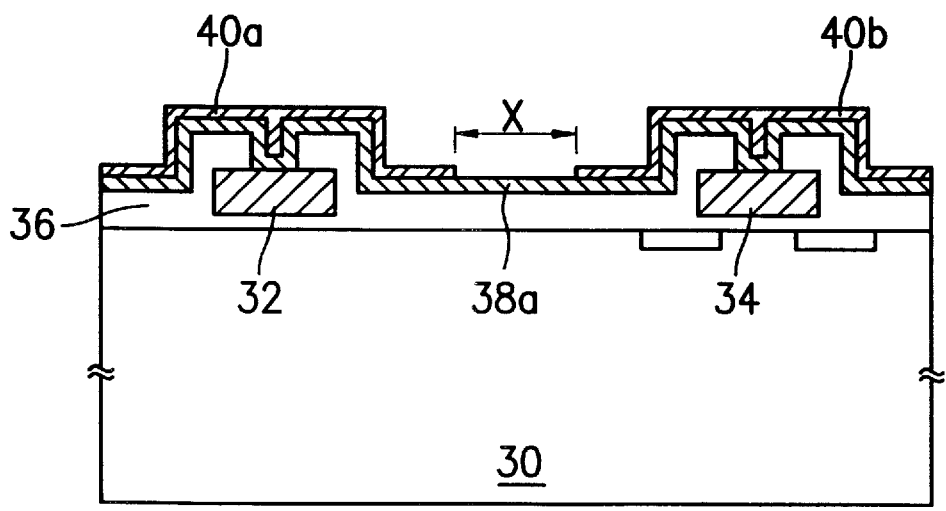
Figure 4:
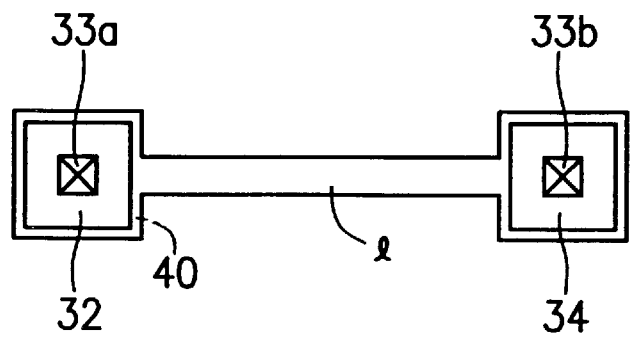
FIG. 4 and FIG. 5 are diagrams showing part of the layout during the fabricating process according to the embodiment of this invention.
Figure 5:
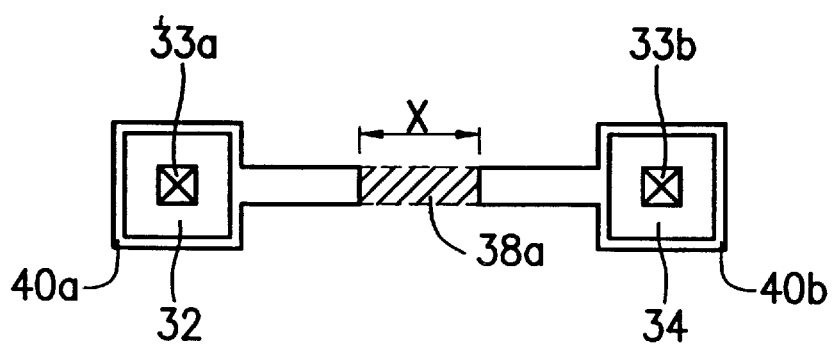

FIGS. 3A through 3E are cross-sectional views showing the steps involved in the production of an SRAM polyload according to one preferred embodiment of this invention, and FIGS. 4 and 5 are diagrams showing part of the layout during the fabricating process according to the embodiment of this invention.

First, referring to FIG. 3A, a conductive layer is formed above a semiconductor substrate 30, for example, by doping ions into a polysilicon layer. Then, the conductive layer is selectively etched to form a conductive gate device 32 and a conductive voltage source line device 34. Next, an insulating layer 36, for example, an oxide layer, is formed above a semiconductor substrate 30. Thereafter, the insulating layer 36 is selectively etched to form a first contact window 33a on the surface of the conductive gate device 32 as well as a second contact window 33b on the surface of the conductive voltage source line device 34. Subsequently, a polysilicon layer 38 with a thickness of approximately 500 Å to 1000 Å is formed above the insulating layer 36 to fill up the first contact window 33a and the second contact window 33b.

Referring next to FIG. 3B, in the subsequent step an ion doping operation is performed aiming at adjusting the resistance of the polysilicon layer 38 to form a polysilicon layer 38a, for example, by doping arsenic ions using an energy of about 50 keV and a dosage of about $7.5 \times 10^{13}$ ions/cm$^2$. Thereafter, the polysilicon layer 38a surface is cleansed by an acid, for example, a CR solution (sulfuric acid/hydrogen peroxide solution) together with hydrogen fluoride (HF) gas.

Referring next to FIG. 3C and FIG. 4, a silicide layer 40 is formed above the polysilicon layer 38a, for example, using a vapor deposition method to deposit a tungsten silicide (WSix) layer (as shown in FIG. 3C). The silicide layer 40 has a thickness of approximately, for example, 300 to 500 angstroms. Then, the silicide layer 40 and the polysilicon layer 38a are sequentially etched to form a piece of conductive wire 1 (as shown in FIG. 4) connecting the first contact window 33a and the second contact window 33b.

Referring next to FIG. 3D, subsequently a photoresist layer 42 is formed by the usual photolithographic processes of photoresist coating, exposure and development.

Finally, referring to FIG. 3E and FIG. 5, the silicide layer 40 not being covered by the photoresist layer 42 is plasma etched exposing the surface of the polysilicon layer 38a below. The exposed polysilicon layer 38a region marked x in FIG. 5 becomes a polyload while those regions such as 40a and 40b where the silicide layers are still retained form the interconnects.

In summary, the main characteristic of this invention lies in the formation of a silicide layer 40 above a polysilicon layer 38a with subsequent etching of the silicide layer to define the interconnect regions and the polyload regions. The advantages of this invention are:

(a) The process of defining the length of a polyload is by photolithographic processes and plasma etching, so there is no need to worry about lateral diffusion length. This readily satisfies the goal of dimensional reduction, for example, design dimensions of as little as 0.2 μm to 0.35 μm can be achieved. For a 0.4 μm SRAM unit memory unit design, a polyload fabricated by a conventional method requires a length of about 1.6 μm while the same polyload just occupy 0.7 μm in this invention Therefore dimensions of each memory unit can be reduced by about 23%, and the overall number of devices per unit of wafer area or the gross die area can be increased approximately by 12% to 15%, resulting in production cost savings.

(b) Greater controllability and repeatability is achieved in production, hence, the resistance Rs of the polyload is more stable.

(c) The contact resistance Rc of a Vcc line is greatly reduced due to the implementation of a silicide layer, therefore problems caused by IR drop are improved and the functionality of devices under low Vcc input is maintained.

(d) The conventional method utilizes heavily doped polysilicon layer as interconnects, while in this invention a silicide layer formed above the polysilicon layer is etched to define the polyload regions and the interconnect regions concurrently, and so there is no need for additional masks and processing steps. Besides, few changes are required in the processing steps, making actual implementation with the existing manufacturing facilities quite easy.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims, which define the invention, should be accorded the broadest interpretation so as to emcompass all such modifications and similar structures.

What is claimed is:

1. A method for fabricating SRAM polyload, comprising the steps of:
    (a) forming an insulating layer above a semiconductor substrate having a conductive gate device and a conductive voltage source line device already formed therein;
    (b) selectively etching the insulating layer to form a first contact window and a second contact window on the surfaces of the conductive gate device and the conductive voltage source line device, respectively;
    (c) forming a polysilicon layer above the insulating layer, and simultaneously filling up the first and second contact windows;
    (d) forming a silicide layer above the polysilicon layer;
    (e) etching the silicide layer and the polysilicon layer to form a conductive wire linking the first contact window with the second contact window; and
    (f) selectively etching a section of the silicide layer on the conductive wire to expose a portion of the polysilicon layer, and forming a polyload in the exposed portion of the polysilicon layer region.

2. A method according to claim 1, wherein the conductive gate device is formed by etching an ion doped polysilicon layer.

3. A method according to claim 1, wherein the conductive voltage source line device is formed by etching an ion doped polysilicon layer.

4. A method according to claim 1, wherein further includes the step of performing an ion doping operation on the polysilicon layer.

5. A method according to claim 4, wherein the ion doping operation is performed with arsenic ions using energy of 50 keV and dosage of about 7.5×1013 ions/cm2.

6. A method according to claim 1, wherein the thickness of the polysilicon layer is between 500 Å to 1000 Å.

7. A method according to claim 1, wherein before step (d) further includes a step of cleansing the surface of the polysilicon layer by an acid.

8. A method according to claim 1, wherein the silicide layer is a tungsten silicide layer.

9. A method according to claim 8, wherein the thickness of the silicide layer is between 300 Å to 500 Å.

10. A method for fabricating SRAM polyload, comprising the steps of:
    (a) forming a first polysilicon layer above a silicon substrate, and then selectively etching the first polysilicon layer to form a polysilicon gate device and a polysilicon voltage source line device;

(b) forming an insulating layer above the silicon substrate and covering the polysilicon gate device and voltage source line devices respectively;

(c) selectively etching the insulating layer to form a first contact window on the surface of the polysilicon gate device and a second contact window on the surface of the voltage source line device;

(d) forming a second polysilicon layer above the insulating layer, and simultaneously filling up the first and second contact windows;

(e) forming a silicide layer above the second polysilicon layer;

(f) etching the silicide layer and the second polysilicon layer to form a conductive wire linking the first contact window with the second contact window; and (g) selectively etching a section of the silicide layer on the conductive wire to expose a portion of the second polysilicon layer, and forming a polyload in the exposed portion of the second polysilicon layer region.

* * * * *